United States Patent [19]
Uchida et al.

[11] Patent Number: 5,684,677
[45] Date of Patent: Nov. 4, 1997

[54] ELECTRONIC CIRCUIT DEVICE

[75] Inventors: Tatsuro Uchida, Yokohama; Takashi Yebisuya, Tokyo; Miki Mori, Yokohama; Masayuki Saito, Yokohama; Takasi Togasaki, Yokohama; Yukio Kizaki, Yokohama, all of Japan

[73] Assignee: Kabushiki Kaisha Toshiba, Kawasaki, Japan

[21] Appl. No.: 688,677

[22] Filed: Jul. 29, 1996

Related U.S. Application Data

[62] Division of Ser. No. 558,222, Nov. 17, 1995, abandoned, which is a continuation of Ser. No. 265,102, Jun. 24, 1994, abandoned.

[30] Foreign Application Priority Data

| Jun. 24, 1993 | [JP] | Japan | 5-153150 |
| Apr. 15, 1994 | [JP] | Japan | 6-077367 |

[51] Int. Cl.⁶ ............ H05K 7/02; H05K 7/10; H05K 1/16
[52] U.S. Cl. ............ 361/770; 361/760; 361/767; 361/768; 361/773; 361/774; 361/808; 174/260; 174/261; 257/737; 257/738; 257/779; 257/780; 257/784; 257/786
[58] Field of Search ............ 257/737–738, 257/778–781, 784, 786; 228/179.1, 180.1, 180.21, 180.22; 29/876, 877, 878, 879; 437/209; 361/760–774, 808; 174/260–261

[56] References Cited

U.S. PATENT DOCUMENTS

| 4,641,222 | 2/1987 | Derfiny et al. | |
| 4,760,948 | 8/1988 | Spiecker . | |
| 5,001,829 | 3/1991 | Schelhorn . | |
| 5,255,839 | 10/1993 | Da Costa Alves et al. | 228/180.21 |
| 5,284,796 | 2/1994 | Nakanishi et al. | 437/209 |
| 5,315,070 | 5/1994 | Maiwald | 174/261 |

FOREIGN PATENT DOCUMENTS

| 0 248 566 | 12/1987 | European Pat. Off. . | |
| 0 322 121 | 6/1989 | European Pat. Off. . | |
| 38 00 116 | 7/1988 | Germany . | |
| 59-193040 | 11/1984 | Japan . | |
| 2155209 | 6/1990 | Japan . | |
| 2156514 | 6/1990 | Japan . | |
| 4130794 | 5/1992 | Japan . | |
| 521260 | 1/1993 | Japan . | |
| 6061609 | 3/1994 | Japan | 361/760 |
| 2037489 | 7/1980 | United Kingdom | 361/760 |
| 2 134 026 | 8/1984 | United Kingdom . | |
| 2 149 581 | 6/1985 | United Kingdom . | |

*Primary Examiner*—Bot L. Ledynh
*Attorney, Agent, or Firm*—Oblon, Spivak, McClelland, Maier & Neustadt, P.C.

[57] ABSTRACT

An electronic circuit device comprising a printed wiring board having a major surface and pads provided on the major surface of the printed wiring board, a plurality of electrodes provided partly on at least one major surface of the leadless component and partly on sides of the leadless component, a plurality of bumps provided on the pads, providing a gap between the major surface of the printed wiring board and the major surface of the leadless component, and electrically connecting those parts of the electrodes which are provided on the major surface of the leadless component to the pads, and a plurality of electrically conductive members integral with the bumps, extending from the bumps to those parts of the electrodes which are provided on the sides of the leadless component.

8 Claims, 9 Drawing Sheets

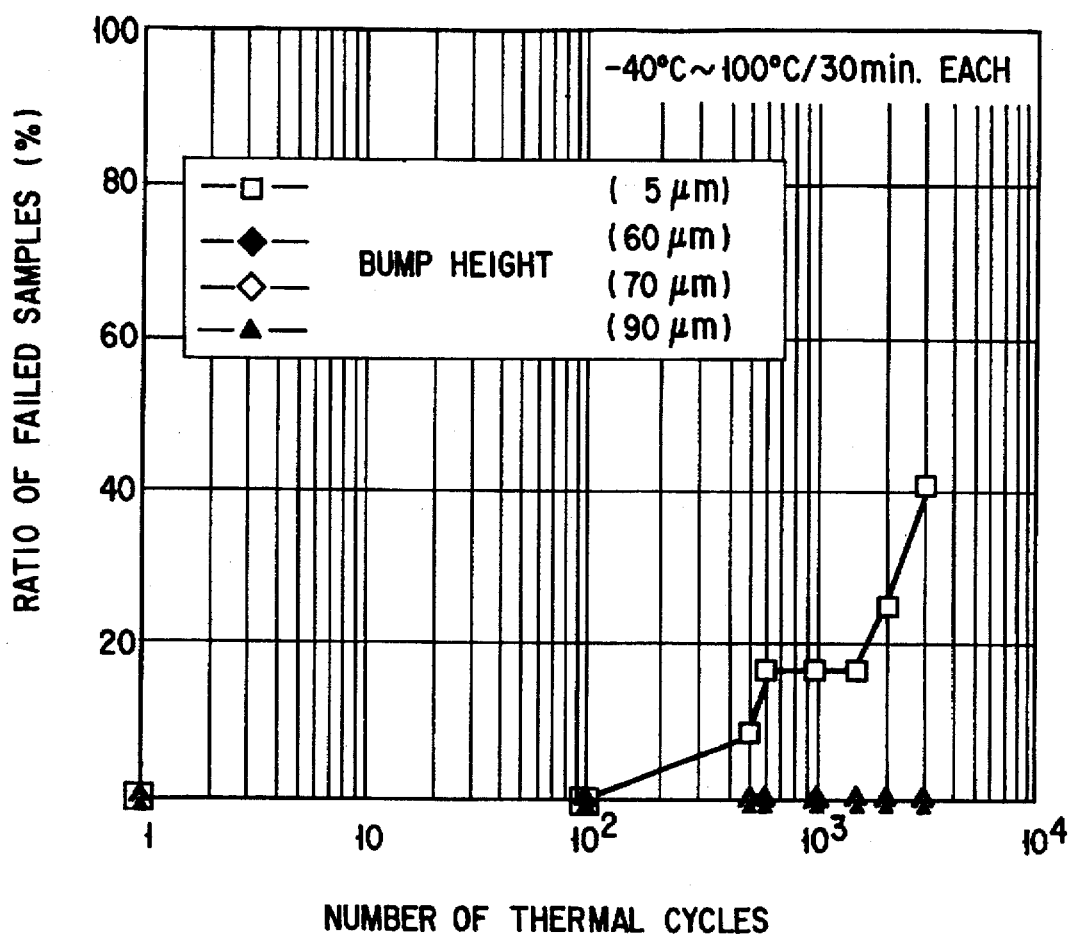
F I G. 5

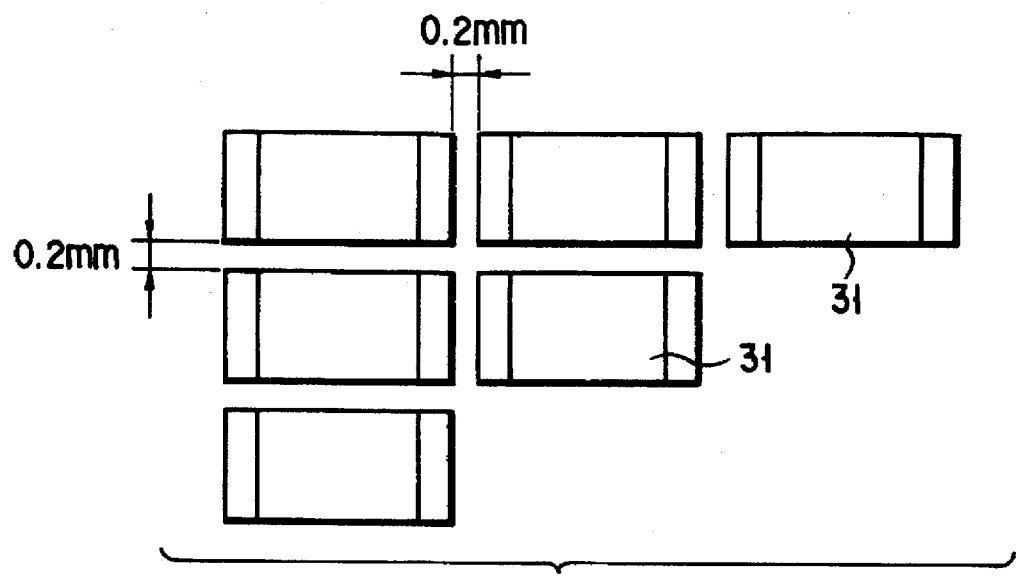
F I G. 13
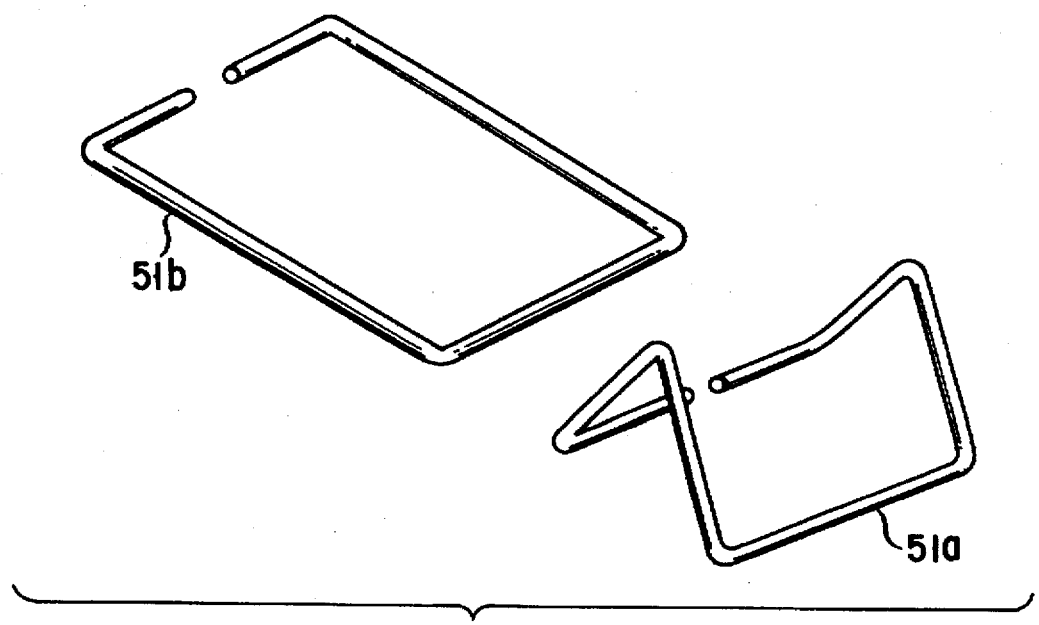
F I G. 14

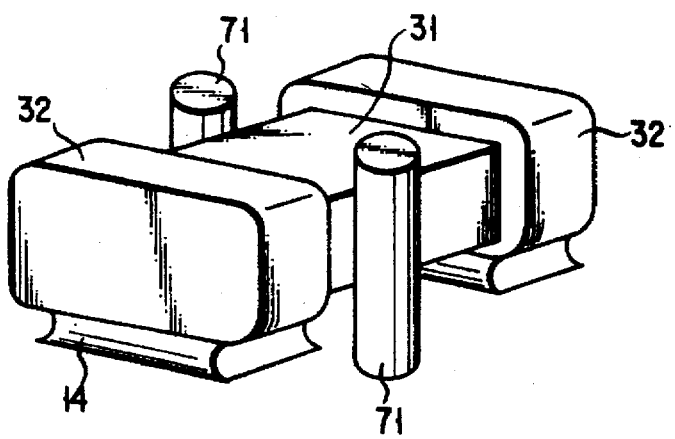
F I G. 18
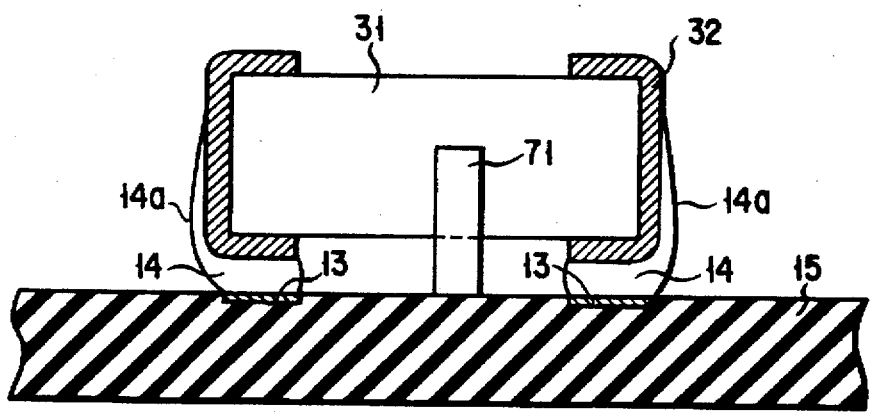
F I G. 19
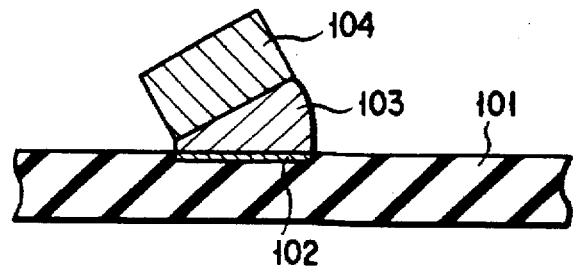
F I G. 20

ELECTRONIC CIRCUIT DEVICE

This application is a Division of application Ser. No. 08/558,222, filed on Nov. 17, 1995 now abandoned, which is a Continuation of application Ser. No. 08/265,102, filed on Jun. 24, 1994, now abandoned.

BACKGROUND OF THE INVENTION

1. Field of the Invention

The present invention relates to an electronic circuit device comprising a printed wiring board and leadless components which are mounted on and connected to the printed wiring board by conductive bumps.

2. Description of the Related Art

In recent years electronic technology has advanced fast. It has made it possible to miniaturize electronic equipments, to utilize electronic components and semiconductor elements in the form of chips, and to provide wiring patterns having high line-density for use in these electronic equipments. It is increasingly demanded that electronic components and semiconductor elements be mounted on a printed wiring board in high density.

In surface mount technology, now employed most widely, use is made of two-terminal leadless components called "chip components," such as passive-element components (e.g., resistors and capacitors). Chip components are mounted on a printed wiring board, with their terminal electrodes connected by a fillet-shaped solder to the pads provided on the printed wiring board. Generally, the reflow soldering method, wherein soldering paste is applied, is employed to mount chip components on a printed wiring board by using a fillet-shaped solder.

The reflow soldering method is classified into hot-air reflow, infrared-ray reflow and vapor-phase soldering. Any of these reflow soldering methods comprises three steps. In the first step, solder paste is print-coated on the pads provided on a printed wiring board. In the second step, chip components are positioned on the solder paste layers thus print-coated. In the third step, the layers of solder paste are melted, thereby mounting the chip components on the printed wiring board. Packages such as QFPs (Quad Flat Packages), each containing a semiconductor device, are mounted on a printed wiring board in a similar method.

The reflow soldering method can be successfully employed only in the case where the pads on the printed wiring board are larger than the chip component electrodes to be mounted on the pads. Consequently, each chip component occupies a relatively large surface area of the printed wiring board. This is a bar to an increase in the mount density of chip components. To minimize the area occupied by each chip component, thereby to increase the mount density, it is proposed that bump interconnection be employed in place of the reflow method.

Bump interconnection, generally known as "flip chip method" in the field of semiconductor chips, is applied to mount chip components which are small plate-shaped components having two rectangular major surfaces of the same size. A plate-shaped component has two flat electrodes on both ends of longer side of at least one of the major surfaces and, in most cases, flat electrodes on both side walls of shorter sides as well. The bump interconnection is performed in the following steps. First, solder paste is print-coated on the pads provided on a printed wiring board, forming solder bumps on the pads. Next, the plate-shaped components are mounted on the printed wiring board, aligned with the solder bumps. Then, the solder bumps are melted, thus electrically connecting the components to the printed wiring board. It suffices to locate each pad right below the electrodes provided on the lower major surface of the plate-shaped component. Therefore, each occupies but a small mount area.

A semiconductor packages such as a QFP occupies a relatively large area due to its leads, and the mount density is inevitably low. For the purpose of increasing mount density, leadless chip carrier packages (hereinafter referred to as "LCC packages") are now mounted on a printed wiring board. Bump interconnection is regarded as an effective method of mounting LCC packages on a printed wiring board in a high density.

Certainly bump interconnection greatly increases the mount density of leadless components such as chip components and LCC packages. However, it is difficult to determine whether or not the leadless components mounted on the board by means of bump interconnection are connected to one another as has been designed. This is because the parts of any adjacent leadless components connected by bumps cannot be observed from above with a magnifying glass or an optical measuring instrument generally used to inspect the leadless components mounted on a printed wiring board.

A thermal cycle occurs in an electronic circuit device as the power dissipating elements included in the device are repeatedly turned on and off, or due to temperature change of circumstance. A thermal stress is applied onto bumps connecting each leadless component of the device to the printed wiring board thereof, due to the difference in thermal expansion coefficient between the leadless component and the printed wiring board. After a long use of the electronic circuit device, the bumps will have cracks because of the thermal stress they have received. As is known in the art, the thermal stress on each bump can be reduced by increasing the height of the bump, to thereby enhance the reliability of the electronic circuit device.

The inventors of the present invention have conducted research on solder bumps connecting two-terminal chip components to a printed wiring board. They have found that if the surface tension of a molten solder bump loses balance, there will take place so-called "rolling phenomenon" wherein a chip component rolls or tilts along its width. FIG. 20 is a sectional view of a part of an electronic circuit device, taken along a line parallel to either shorter side of the chip component of the device. As can be understood from FIG. 20, rolling phenomenon has occurred in the chip component. An electrode 104 on a shorter side of the component is connected to the pad 102 formed in the surface of the printed wiring board 101 by means of a solder bump 103. The solder bump 103 has been deformed, and the chip component is inevitably inclined to the surface of the printed wiring board 101. The taller the bump, the more prominent the rolling phenomenon.

As indicated above, it is desirable that the bump be tall to reduce the thermal stress applied on it and, ultimately, to increase the reliability of the electronic circuit device. As disclosed in, for example, Jpn. Pat. Appln. KOKAI Publication No. 2-155209, a bump can be made taller by covering the sides of a chip electrode with material unable to be wetted by solder, thus allowing the solder to wet only the lower surface of the chip electrode. If the bump is made taller, however, rolling phenomenon will be more likely to occur. Once a chip component has been connected to bumps, inclined to the printed wiring board due to the rolling phenomenon, the bumps are also inclined to the board, each having a tall portion and a short portion. The thermal stress concentrates on the short portion of the bump, inevitably impairing the reliability of the bump.

Rolling phenomenon is less likely to occur with multi-terminal leadless components, such as LCC packages and passive-element components (e.g., network-resistor components). But multi-terminal leadless components may be inclined to a printed wiring board, because solder can hardly be applied in the same amount to the electrodes of each component. The electronic circuit device comprising the multi-terminal leadless components may fail to be as reliable as desired.

SUMMARY OF THE INVENTION

An object of the present invention is to provide an electronic circuit device comprising a printed wiring board and leadless components which are mounted on the printed wiring board in high reliability and high density and which has mechanically strong and electrically reliable connections between the printed wiring board and the leadless components which can be inspected with ease after mounted on the printed wiring board.

Another object of the inventions to provide an electronic circuit device comprising a printed wiring board and two-terminal chip components which are mounted on the printed wiring board and prevented from rolling phenomenon, thereby imparting high reliability to the electronic circuit device.

Another object of the invention is to provide an electronic circuit device comprising a printed wiring board and leadless components which are mounted on and not inclined to the printed wiring board, thereby imparting high reliability to the electronic circuit device.

To achieve the objects, there are provided electronic circuit devices according to the present invention.

In a first aspect of the invention, there is provided an electronic circuit device which comprises: a printed wiring board having a major surface and pads provided on the major surface; a leadless component located above the major surface of the printed wiring board and having a major surface opposing the major surface of the printed wiring board; a plurality of electrodes provided on at least a part of the major surface and one side of the leadless component; a plurality of bumps electrically connecting the pads and providing a gap between the major surface of the printed wiring board and the major surface of the leadless component; and a plurality of electrically conductive members integral with the bumps, extending from the bumps onto the sides of the leadless component, respectively.

In a second aspect of the invention, there is provided an electronic circuit device which comprises: a printed wiring board having a major surface and pads provided on the major surface; a two-terminal chip component located above the major surface of the printed wiring board; a plurality of bumps provided on the pads, providing a gap between the major surface of the printed wiring board and the two terminal chip component, and electrically connecting electrodes of the two-terminal chip component to the pads; and a spacer provided in the gap.

In the third aspect of the invention, there is provided an electronic circuit device which comprises: a printed wiring board having a major surface and pads provided on the major surface; a leadless component located above the major surface of the printed wiring board and having a major surface opposing the major surface of the printed wiring board; a plurality of electrodes provided on at least a part of the major surface and one side of the leadless component; a plurality of bumps electrically connecting the electrodes to the pads and providing a gap between the major surface of the leadless component and the major surface of the printed wiring board; a plurality of electrically conductive members integral with the bumps, extending from the bumps onto the sides of the electrodes of the leadless component, respectively; and a spacer located in the gap between the major surface of the leadless component and the major surface of the printed wiring board.

In the electronic circuit device of the first aspect, each conductor which is integral with one bump extends onto the side of one electrode of the leadless component. Therefore, each bump has an increased contacting area with respect to the electrode 32. The connection between the bumps and the electrodes is strong mechanically and resistant to thermal stress, ensuring reliable electrical connection between the leadless component and the printed wiring board. Furthermore higher thermal conductivity can be obtained due to the increased contacting area, which enables the heat generated in the leadless component to dissipate easily thereby. The electric circuit device therefore has improved reliability. Furthermore, whether or not each conductor adheres to the side of the electrode of the component can easily be determined by observing the device from the above. Moreover, it is possible to mount leadless components in high density.

In the electronic circuit device of the second aspect, the spacer interposed between the printed wiring board and the two-terminal chip component serves as a support, preventing the two-terminal chip component from rolling to one shorter side. The thermal stress is thereby uniformly distributed to the junctions between the bumps and the two-terminal chip component. In other words, the stress does not concentrate at the junction of a particular bump and the two-terminal chip component.

The electronic circuit device of the third aspect has a spacer, and electrically conductive members which are integral with bumps, extending onto the sides of the electrodes of a leadless component, which helps to improve the electrical characteristics of the electric equipment incorporating this electronic circuit device. When bumps are melted under reflow soldering, excess solder flows wetting onto the sides of the electrodes of a leadless component, thus setting the leadless component on a spacer at the height of the spacer like self aligning. The spacer sets the leadless component apart from the printed wiring board for a desired distance, whereby the stray capacitance between each electrode of the leadless component and the pad or trace on the printed wiring board changes but less than otherwise. The electronic circuit device can therefore have designed characteristics, as is desired particularly in high-frequency equipment.

Spacer serves to make the bumps so tall that the device has reliability. The spacer also prevents the leadless component from inclining due to the difference in height among the bumps formed by applying solder onto the pads.

The electric circuit device of the third aspect has not only the advantage of the device according to the first aspect, but also that of the device according to the second aspect, and moreover has the advantage of the self-aligning like setting of a leadless component on a spacer as described above.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a diagram illustrating the relationship between the ratio of failed samples and the number of thermal cycles, which is observed with the first embodiment of the invention;

FIG. 13 is a diagram illustrating the arrangement of the chip components of an electronic circuit device according to the present invention;

FIG. 14 is a perspective view of a member made of shape-memory alloy, for explaining how this member operates in an electronic circuit device according to a fifth embodiment of the invention;

FIG. 18 is a perspective view of an electronic circuit device according to an eighth embodiment of the present invention;

FIG. 19 is a partly sectional front view of the advice shown in FIG. 18; and

FIG. 20 is a sectional view of a part of an electronic circuit device, for explaining rolling phenomenon of a chip component.

DETAILED DESCRIPTION OF THE PREFERRED EMBODIMENTS

Embodiments of the present invention will be described, with reference to the accompanying drawings.

Figure 1A:
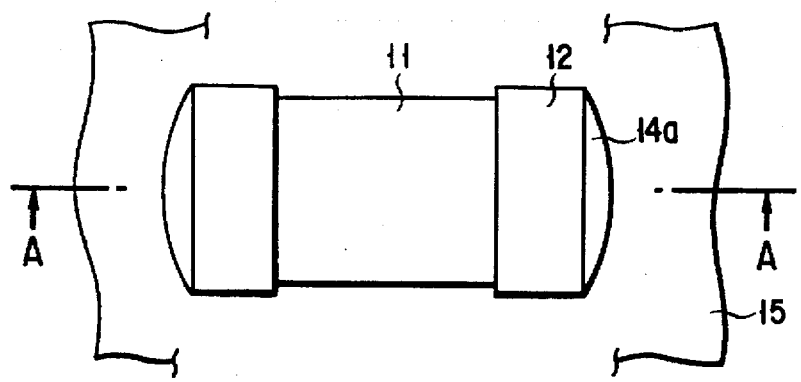
FIG. 1A is a plan view showing a part of an electronic circuit device which is a first embodiment of the present invention.
Figure 1B:
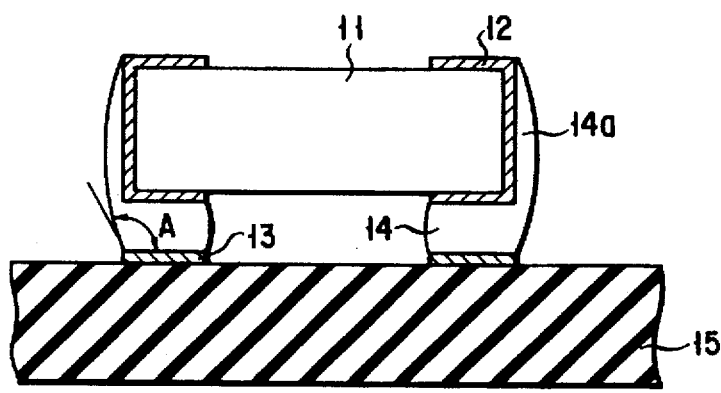
FIG. 1B is a sectional view of the device, taken along line A—A in FIG. 1A.
Figure 2:
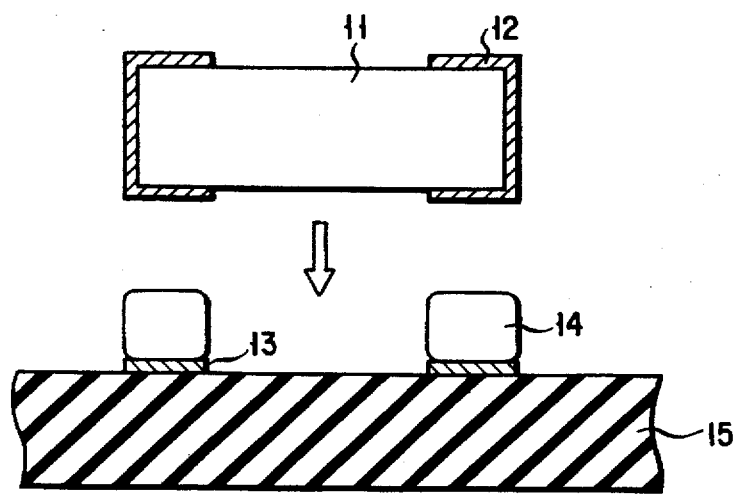
FIG. 2 is a sectional view of the device shown in FIG. 1B, which is in the process of manufacture.
Figure 3A:
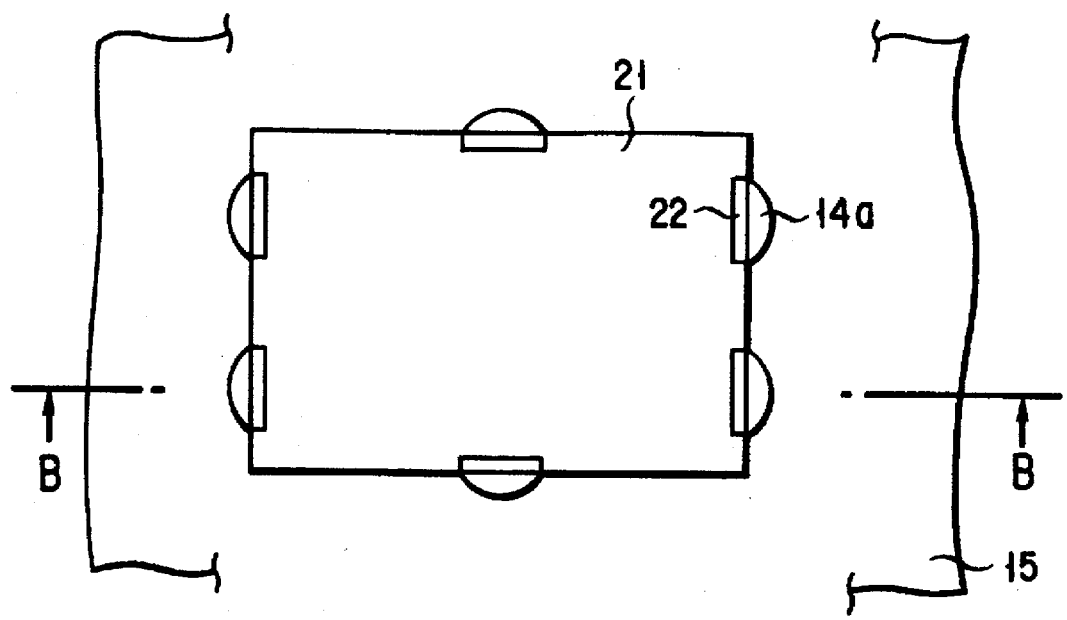
FIG. 3A is a plan view showing another part of the device which is the first embodiment.
Figure 3B:
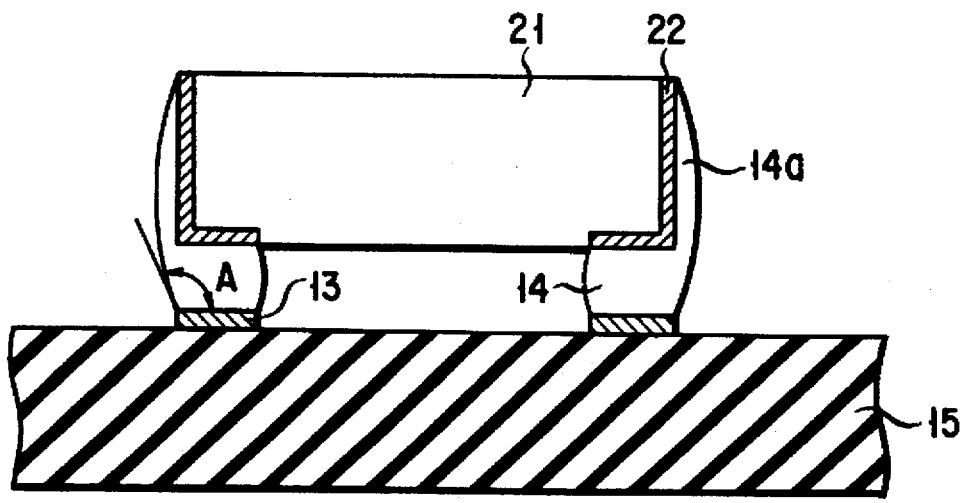
FIG. 3B is a sectional view of the device, taken along line B—B in FIG. 3A.

FIG. 1A, FIG. 1B, FIG. 2, FIG. 3A and FIG. 3B show an electronic circuit device according to the first embodiment of the invention. More precisely, FIGS. 1A, FIG. 1B and FIG. 2 show a part of the device, which has a two-terminal leadless component 11 (hereinafter called "chip component"); FIG. 3A and FIG. 3B show another part of the device, which has a multi-terminal leadless component 21 (e.g., an LCC package or a network component). Namely, the first embodiment comprises two-terminal leadless components 11 and multi-terminal leadless components As shown in FIGS. 1A and 1B, the first part of the device comprises a printed wiring board 15, two pads 13 formed on the upper surface of the board 15, a chip component 11 having two electrodes 12, and two bumps 14 connecting the electrodes 12 to the pads 13, respectively. Since the greater part of either bump 14 is interposed between the electrode 12 and the pad 13, the chip component 11 is spaced apart from the printed wiring board 15.

FIG. 2 shows the chip component 11 which has yet to be mounted on the printed wiring board 15. The chip component 11 is mounted on the board 15 in the following manner. First, the chip component 11 is positioned with respect to the printed wiring board 15 such that the electrodes 12 are aligned with the bumps 14 already print-coated on the pads 13. Then, the chip component 11 is placed on the bumps 14, with the electrodes 12 contacting the bumps 14. Pressed by the chip component 11, either bump 14 is shaped like a beer barrel, because of the surface tension of the bump 14.

The chip component 11 has two electrodes 12, each covering one side of the element 11 and having a part mounted on the lower surface of the element 11. Either bump 14 wets the lower surface of the electrode 12, as well as the side of the electrode 12. The wetting is promoted when the bump 14 is made of solder and melted during the reflow method. As a result, a part 14a (FIG. 1A and 1B) of either bump 14 covers the side of the electrode 12. The electrodes 12 and the bumps 14 must be made of such electrically conductive materials that can wet each other thoroughly.

As shown in FIG. 3A and FIG. 3B, the other part of the electronic circuit device comprises six pads 13 formed on the upper surface of the board 15, an LCC package having six electrodes 22, and six bumps 14 connecting the electrodes 22 to the pads 13, respectively. Since the greater part of each bump 14 is interposed between the electrode 22 and the pad 13, the LCC package 21 is spaced apart from the printed wiring board 15. Each bump 14 wets the lower surface of the electrode 22, and a part 14a of the bump 14 wets the side of the electrode 22.

Not only in FIGS. 3A and 3B but also other similar figures to be referred to later, the components identical to those shown in FIGS. 1A and 1B are denoted at the same reference numerals.

The printed wiring board 15, on which the leadless components 11 and 21 are mounted, can be an insulating board or made of a metal core board, on which wires can be formed. The insulating board can be made of various insulating materials, among which are: alumina, aluminum nitride, glass, glass ceramics, epoxy resin, aramid fiber, polyimide resin, Teflon.

The pads 13 and the wires (not shown) may be made of one of electrically conductive materials, selected in accordance with the material of the printed wiring board 15. Among the electrically conductive materials are: silver, silver-palladium alloy, silver-platinum alloy, copper, aluminum, nickel, tungsten, molybdenum and chromium. In the case where the pads 13 and the wires are made of a metal which can readily be oxidized, they may be gold-plated or tin-plated. Copper-plated or tin-plated wires are preferable since they can easily be wetted by solder. Also desirable are gold-plated wires, which can be wetted well by solder containing indium or tin or by conductive resin paste.

The electrodes of the leadless components 11 and 21 are made of silver-palladium alloy. Alternatively, they are plated with tin or solder. More specifically, the electrodes 21 of the LCC package 21 are made of tungsten, molybdenum or the like and plated with titanium, nickel or gold, if the package 21 is a ceramic one. In the case where the LCC package 21 is a resin one, its electrodes 22 are made of copper plated with nickel layer which plated with gold or tin.

The bumps 14 can be formed of solder or solder paste containing any combination of two or more elements selected from the group consisting of tin, lead, silver, indium, bismuth, zinc, antimony, cadmium, gallium, germanium and the like. Alternatively, the bumps 14 can be formed of a conductive resin paste containing silver or copper. Desirable as the material of the bumps 14 is a solder paste containing any combination of at least two elements selected from the group consisting of tin, lead, antimony, indium and bismuth.

In this embodiment, the printed wiring board 15 is made of copper-clad glass epoxy resin, the pad 13 formed on the board 15 are made of copper, and the bumps 14 are formed of tin-lead eutectic solder paste. The electrodes 12 of the chip component 11 are silver-palladium alloy layers which are plated with a 1 μm nickel film which in turn is plated with a 3 μm solder film. The electrode 22 of the LCC package 21 are copper layers which are plated with a 1 μm nickel film, which in turn is plated with a 0.05 μm gold film.

With reference to FIGS. 1A and 1B and FIG. 2, it will explained how the electronic circuit device described above is manufactured. Since the chip component 11 and the LCC package 21, either being a leadless component, are mounted on the printed wiring board 15 in the same way, the mounting of the chip component 11 only will be described below.

First, the pads 13 are formed on the printed wiring board 15 made of glass epoxy resin. The pads 13 can be formed in two alternative methods. The first method is perform electroless plating or electroplating. The second method is to apply optical exposure on a metal foil bonded on the printed wiring board 15. In this embodiment, the pads 13 are formed by bonding a 35 μm copper foil is bonded onto the board 15, coating a resist on the copper foil, conducting exposure on the resist, and effecting development process on the resist and foil. Anti-corrosion treatment has been applied onto the surface of the copper foil.

Next, solder paste is applied onto the pads 13 by means of screen printing. If necessary, a solder resist (not shown) has been applied to the surface of the printed wiring board 15, thereby preventing the solder paste from sticking to the printed wiring board 15. In the screen printing a screen mask is used, which has any desired thickness, usually ranging from 50 to 300 μm. A mask having a thickness of 75 to 200 μm is preferred for forming bumps to mount a chip component or an LCC package on a printed wiring board. The most preferable is a screen mask whose thickness ranges from 100 to 150 μm. In the present embodiment, use is made of a screen mask which is 100 μm thick.

The solder paste can be any one that is formed of low-melting conductive particles, flux, binder resin and the like. The conductive particles are made, as in most cases, of a metal such as tin, lead, indium, bismuth, silver or the like, or an alloy of these metals. In this embodiment, the solder paste is one consisting of 63 wt % of tin and 37 wt % of lead. The conductive particles may have any diameter desired, usually 100 μm or less. In the present embodiment, the particles have a maximum diameter of 53 μm or less. A variety of tin-lead eutectic alloy solder pastes are commercially available. Paste No. oz63-201C-50-9, manufactured by SenJu Kinzoku Kogyo Co., Ltd., is employed in the present embodiment. This solder paste is applied by screen printing in this embodiment. Nonetheless, the solder paste may be applied by means of a dispenser. Furthermore, a conductive adhesive containing silver, copper, silver palladium alloy or the like may be utilized in place of the solder paste.

The size of the pads 13 depends on the leadless component to be mounted on the printed wiring board 15 and also on the amount of the solder paste or the conductive adhesive used. Generally, pads extend 0.05 to 0.4 mm in the lengthwise direction of the component and 0.1 to 0.6 mm in the widthwise direction of the component if the leadless component is a so-called 1005 type chip component (planar size: 1.0×0.5 mm). In most cases, it is desirable that the pads extend 0.15 to 0.35 mm and 0.3 to 0.5 mm in the lengthwise and widthwise directions of the leadless component, respectively. In the present embodiment, the pads 13 are those each extending 0.3 mm and 0.5 mm in the lengthwise and widthwise directions of the leadless component, respectively. The chip component 11 and the LCC package 21 are positioned such that their sides vertically align with the outer edges of the pads 13.

Then, the chip component 11 and the LCC package 21 are mounted on the printed wiring board 15 as is shown in FIG. 2. Since they are standard ones, they are mounted by means of a chip mounter sold in the market.

After the chip component 11 and the LCC package 21 have been mounted on the board 15, the solder paste is melted by the reflow method, thereby soldering the chip component 11 and the LCC package 21 to the printed wiring board 15. The conditions of the reflow method somewhat depend on the material and size of the board 15 and also on the types of the components 11 and 21. In this embodiment, the maximum temperature for the solder paste is set at 225° C.

An electronic circuit device of the type according to the first embodiment was made by the method described above. The solder bumps 14 of this device were connected to not only the lower surfaces of the electrodes 12 and 22 of the components 11 and 21 but also the side of the electrodes 12 and 22, as is illustrated in FIGS. 1B and 3B. The solder bumps 14 differed in shape, but very slightly. The angle, contact angle A, between the outer surface of each bump 14 and the upper surface of the pad 13 on which the bump 14 was deposited was about 115°.

When the device was viewed from above, it was observed that the solder bumps 14 bulged from the sides of either leadless component. This means that a part 14a of each solder bump 14 stuck to the side of the corresponding electrode 12 or 22. The portion 14a was semispherical because of the surface tension on the solder paste. The outermost point on the semispherical surface of the bump part 14a was located at about half the width of the electrode 12 or 22.

The device was inspected to see whether or not the leadless components 11 and 21 were connected to the pads 13 as desired. (Generally, the rate of electrode disconnection is relatively high in electronic circuit devices made in small quantities, such as sample devices, whereas the rate is far less than 1% in electronic circuit devices manufactured in large quantities.)

The inspection may be conducted by electric means after the devices have been completed and may require much time to identify any electrode disconnected from the pad. It would cost much to repair any disconnected electrode found. The electric means used in the inspection cannot serve to determine how the solder is wetting the electrodes or how it sticks to the electrodes. To determine these conditions of the solder, the device must be inspected again by an optical means. Therefore, it is desirable that the leadless components be optically examined immediately after they have been mounted on the printed wiring board 15.

An electronic circuit device, in which the electrodes of each chip component have no sides wetted or covered by solder, was made to be compared with the electronic circuit device according to the present invention. The comparative device was also inspected. When the comparative device was viewed from above, no contact portions could not be seen at all. By contrast, with the device of the invention it was observed that a part 14a of each bumps 14 bulged from the side of either leadless component, indicating that the side of the corresponding electrode was wetted by the bump part 14a. It should be noted that the outermost point on the semispherical surface of each bump part 14a was located at about half the width of the electrode.

The electronic circuit device actually made by the method described above had modules including chip components ranging from 1005 model (1.0×0.5 mm) to 3216 model (3.2×1.6 mm), and LCC packages, some of which had 44 pins, some other of which had 80 pins, and the rest of which had 144 pins. These modules were inspected. It was found that the modules had, on average, about three of about 1,850 contacts were not connected to the pads as was desired.

The electronic circuit device of this invention and the comparative electronic circuit device were further inspected by an optical inspection apparatus of the type widely employed at present. Registered in the inspection apparatus were various items of information about each leadless component (e.g., size, shape and the like). The information items were compared with the information representing the features of the image of each leadless component mounted on the printed wiring board. The quality was successfully determined by inspecting whether or not the sides of the electrodes of the component were wetted by parts of solder bumps.

The electronic circuit device may be viewed not only from above, but also sideways or obliquely, in order to determine whether or not the leadless components 11 and 21 are connected to the pads 13. Viewed sideways or obliquely, the device can be easily inspected as to whether or not the sides of the electrodes of each leadless component are wetted by solder.

The gap between the printed wiring board and each leadless component depends on the amount of the solder applied, the weight of the component, and the condition of the reflow. The greater the amount of the solder applied, the more solder flows onto the sides of the leadless component, and the more easy it is to determine if the solder wets the sides of the component. The reflow temperature may be changed to adjust the gap between the printed wiring board and each leadless component. If the wetting of the electrodes is controlled, the amount of solder that will stick to the sides of the electrodes decreases, broadening the gap between the printed wiring board and the component. If the leadless component is heavy and the reflow temperature is high, the wetting of the electrodes will be promoted, narrowing the gap. Further, the material of the electrodes may be changed so as to adjust the gap between the printed wiring board and the leadless component. Moreover, in order to adjust the gap, that portion of each electrode which is provided on the lower surface of the component may be made of a metal very wettable with solder even at low temperatures, and that portion which is laid on the side of the component may be made of a metal less wettable with solder at low temperatures.

Since the sides of the chip component 11 are aligned with the outer edges of the pads 13, the bumps 14 do not bulge sideways too much. The component 12 can therefore be mounted on the printed wiring board 15 in high density. Since the bump 14 contacts both the lower surface of the electrode 12 and the side thereof, it electrically connects the chip component 11 to the pad 13 more reliably than otherwise. The contact angle A, as defined above, is 90° or more. This will result in an advantage. The solder paste print-coated on each pad 13 is melted in the reflow process, and a part of the solder paste flows onto the the side of the electrode 12, wetting not only the lower surface of the electrode 12 but also the side thereof. Since the contact angle A is 90° or more, the bump 14 formed of the solder paste bulges from the side of the electrode. The bulging part 14a of the bump 14 can be seen when the chip component 11 is looked at from above. This makes it easy to examine whether or not the electrode 12 is electrically connected to the pad 13 by the bump 14.

As shown in FIG. 1A, the part 14a of each bump 14 is semispherical, and its outermost point is located at about half the width of the electrode 12. This also facilitates the inspection of the electrical connection between the chip component 11 and the pads 13.

The part 14a of each bump 14 extends onto the side of the electrode 12 of the chip component 11. Hence, each bump 14 is integral with electrode 12, having an increased contacting area with respect to the electrode 12. The connection between bumps and the electrode is therefore made mechanically strong, ensuring reliable electrical connection between the chip component and the printed wiring board. This enhances the reliability of the electronic circuit device, for instance, against thermal cycling stress.

Another electronic circuit device, which is the second embodiment of the invention, will be described with reference to FIGS. 1A and 1B and FIG. 2, too. This device is one manufactured in the same method as the first embodiment, but differs in that the wiring substrate is made of alumina and the pads are made of gold, whereas in the first embodiment the board is made of glass epoxy resin and the pads are made of copper.

The second embodiment was made in the following method.

First, a tantalum nitride film, a Nichrome film and a gold film were sequentially formed, one upon another, on an alumina printed wiring board 15 having a thickness of 0.635 mm. The gold film, i.e., the uppermost film, was 4 μm thick. These metal films were patterned, forming lines (not shown) and pads 13. Then, solder paste was applied onto the pads 13 by means of screen printing, thereby forming bumps 14. A chromium film had been formed on the gold film and patterned, and had served as a solder resist (not shown), preventing the solder paste from sticking to the printed wiring board 15. The screen mask used had a thickness of 150 μm, and the solder paste used was No. oz63-201C-50-9, manufactured by SenJu Kinzoku Kogyo Co., Ltd.

The leadless components used in the second embodiment were chip components 11 of 1005 type (planar size: 1.0×0.5 mm), and the pads 13 were those extending 0.3 mm and 0.5 mm in the lengthwise and widthwise directions of the chip component 11, respectively. Each of the chip components 11 was positioned such that its longer side ends vertically aligned with the outer edges of the pad 13. The chip component 11 was mounted on the printed wiring board 15. Since the chip component 11 was a standard one, it was mounted by means of a chip mounter sold in the market.

After the chip components 11 had been mounted on the board 15, the solder paste was melted by the reflow method, thereby soldering the chip components 11 to the printed wiring board 15. The maximum temperature for the solder paste was set at 225° C. The gold layer of each pad 13, i.e., the upper most layer, reacted with the tin contained in the solder, increasing the viscosity of the solder. The wetting ability of the solder was thereby reduced. As a result, the gap between each chip component 11 and the printed wiring board 15 increased to about 60 μm, which was about twice greater than in the first embodiment. Needless to say, leadless component of any other type, such as LCC packages and network components, may be mounted on the printed wiring board 15 in the same way as the chip components 11.

It will be considered how the height of the bumps influences the reliability of the connection between a leadless component and a printed wiring board. If the leadless component and the board have different thermal expansion coefficients, thermal fatigue will accumulate in the bumps which electrically connect the electrodes of the leadless component to the pads provided on the printed wiring board. When the fatigue amounts to a critical value, the bumps may be broken to cause electrical disconnection of the leadless component from the printed wiring board. Hence, the stress or strain on the bumps is a criterion for evaluating the reliability of the connection between the leadless component and the printed wiring board. To evaluate the connection reliability, the maximum equivalent plastic strain on each bump was calculated by simulation, and sample devices were subjected to a thermal shock test, wherein the sample devices were repeatedly cooled and heated in air, each time cooled at −40° C. for 30 minutes and then heated at +100° C. for 30 minutes.

Figure 4:
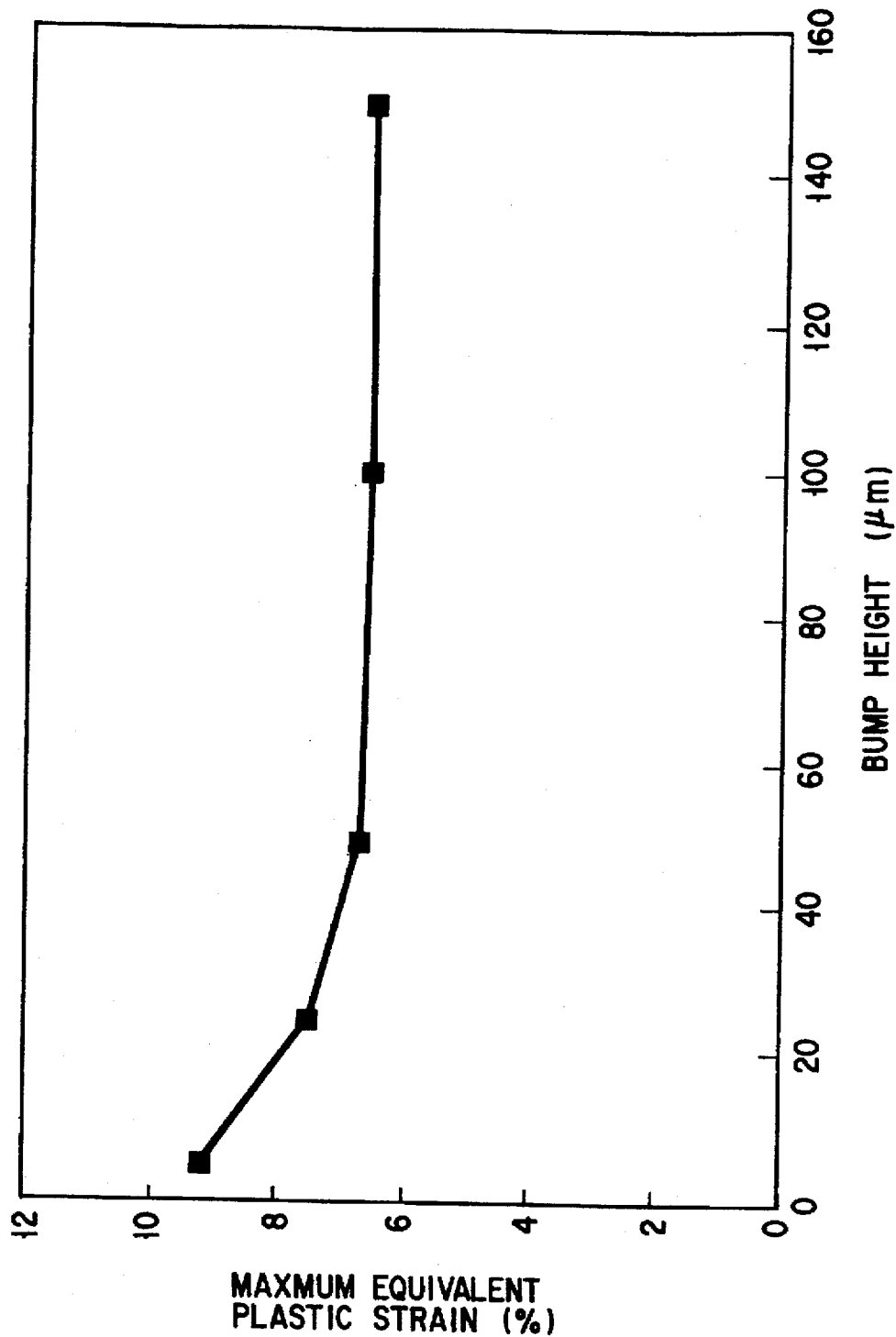
FIG. 4 is a diagram representing the relationship between maximum equivalent plastic strain and bump height, which is observed with the first embodiment of this invention.

FIG. 4 is a diagram representing the relationship between the maximum equivalent plastic strain and the bump height, which as observed by simulation with an electronic circuit device comprising a glass-epoxy resin printed wiring board and a chip component of 1608 type (planar size: 1.6×0.8 mm). The bumps used in the device subjected to the simulation were beer barrel-shaped ones. That part of each bump which covered the side of the electrode was not taken into consideration in the simulation. As illustrated in FIG. 4, the maximum equivalent plastic strain on the bump decreased as the bump height increased up to 50 μm, and remained almost unchanged as the bump height further increased. In particular, when the bump height was 50 μm or less, the strain was particularly prominent, indicating that the connection between the chip component and the glass-epoxy resin board was not so reliable as desired.

The sample devices subjected to the aforementioned thermal shock test comprises a chip component of 1608 type. To be more specific, four groups of sample devices were made for experimental purpose. The devices of the first group had bumps 5 μm high; the devices of the second group had bumps 60 μm high; the devices of the third group had bumps 70 μm high; and the devices of the fourth group had bumps 90 μm high. The results of the thermal shock test were as is shown in FIG. 5. In FIG. 5, the ratio (%) of all failed samples is plotted on the abscissa, and the number of thermal cycles on the ordinate. The term "failed sample" means a sample device which had the connection resistance increased two or more times as the result of the thermal shock test. As is evident from FIG. 5, the samples of the second, third and fourth groups, which had bumps at least 60 μm high, did not have connection failure even after 3,000 thermal cycles. By contrast, the samples of the first group, which had bumps 5 μm high, developed connection failure after 500 thermal cycles.

The results of the thermal shock test show that the bumps must have a height equal to or greater than a specific value in order to secure reliable electrical connection between the chip component and the glass-epoxy resin board. It is therefore necessary to determine the bump height best possible for any device comprising a leadless component other than 1608 type and a printed wiring board other than a glass-epoxy resin one. No adequate reliability can otherwise be imparted to the connection between the leadless component and the printed wiring board.

To make the bumps sufficiently high, the solder-wetting of each electrode of the leadless component may be utilized. Alternatively, a spacer may be interposed between the printed wiring board and the leadless component, thereby increasing the gap between the board and the component.

An electronic circuit device, which is the third embodiment of the invention and which comprises a spacer, will be described with reference to FIGS. 6 and 7.

Figure 6:
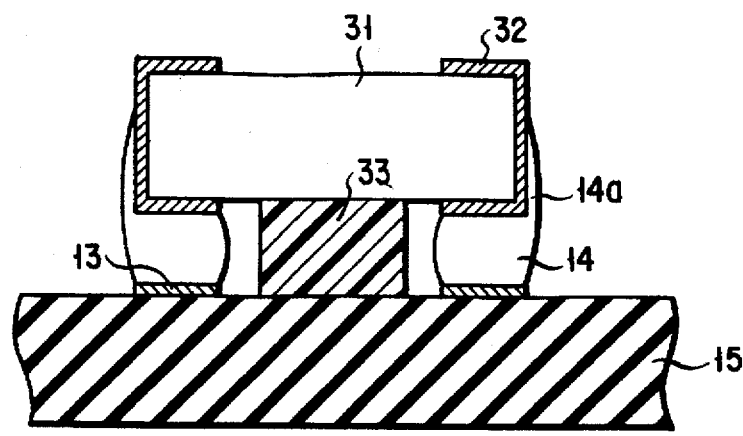
FIG. 6 is a sectional view of an electronic circuit device according to a third embodiment of the present invention.

As shown in FIG. 6, this device comprises a printed wiring board 15, pads 13 arranged on the board 15, a spacer 33 mounted on the board 15, a leadless component 31 placed on the board 15 and having electrodes 32, and bumps 14, each provided between one pad 13 and one electrode 32 of the component 31 and thus electrically connected the electrode 32 to the pad 13. The leadless component 31 may be a two-terminal chip component, a multi-terminal LCC package, or a multi-terminal network component.

In this embodiment, the spacer 33 provided between the printed wiring board 15 and the leadless component 31 prevents the leadless component 31 from sinking under its own weight. The bumps 14 are therefore taller than their counterparts of the first embodiment. It follows that a smaller part 14a of each bump 14 wets the side of the corresponding electrode 32 comparing with the first embodiment.

An electronic circuit device according to the third embodiment of the invention was manufactured as follows.

First, a copper foil was formed on a glass-epoxy resin substrate 15. The copper foil was etched, forming a plurality of pads 13 which were to be connected to the leadless component 31.

Next, a spacer 33 was formed on the printed wiring board 15 and among the pads 13. The spacer 33 was formed by means of exposure and development, using resist material for dry film, thus rising from a prescribed portion of the printed wiring board 15. Alternatively, the spacer 33 made by machining process to a design size may be bonded to a prescribed portion of the printed wiring board 15. The spacer 33 may be made of resin or metal. It is desirable that the spacer 33 have the same height as any other spacer formed on the board 15. Nonetheless, it may have a different height which is suitable for the leadless component 31.

Then, solder was applied onto the pads 13, forming bumps 14, by means of printing using a metal mask placed on the spacer 33. Instead, the solder may be applied by a dispenser. The solder used was the solder paste manufactured by Kohki Co., Ltd., available in the form of balls having a diameter of 50 μm or less.

If the spacer 33 has a height of more than tens of microns, a gap as wide as the height of the spacer 33 will be formed between the metal mask and the printed wiring board 15. In this case, the metal mask may fail to contact the pads 13, preventing the solder from flowing onto the pads 13 through the openings of the metal mask. To solve this problem, the metal mask used had a recess formed by half etching in the surface facing the printed wiring board 15. The metal mask was placed on the printed wiring board 15, with the spacer 33 entirely received in the recess. Thus, there was no gap between the metal mask and the printed wiring board 15. The solder was applied onto the pads 13, forming bumps 14, in the method described above.

Next, the electrodes 32 of the leadless component 31 was put on the solder bumps 14, and the leadless component 31 was mounted on the printed wiring board 15 by the reflow method. The electronic circuit device of this embodiment was thereby manufactured.

If the solder is applied in different amounts, forming the solder bumps 14 for electrodes 32 of the leadless component 31, excess solder flows during reflow soldering onto the sides of the electrodes 32 which are wettable to solder, setting the leadless component 31 on the spacer 31 at the height thereof, and resulting in the formation of the uniform height of the bump 14. Therefore, the stray capacitance between each electrode 32 and the pad 13 or trace on the printed wiring board 15 is made uniform, imparting the designed characteristics to the electronic circuit device.

In the method described above, the leadless component 31 was mounted after the spacer 33 had been formed on the printed wiring board 15. Instead, the spacer 33 may be formed on the lower surface of the leadless component 31, and the resultant component-spacer unit may then be mounted on the printed wiring board 15. If this is the case, there will be no gap between the printed wiring board 15 and the metal mask at the time of applying the solder to form the bumps 14. Hence, it will be unnecessary to use a half-etched metal mask.

Figure 7:
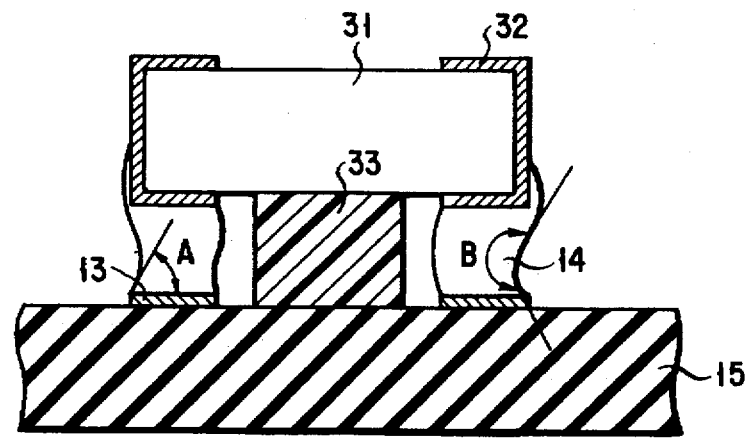
FIG. 7 is a sectional view of a modification of the device shown in FIG. 6.

As shown in FIG. 7, the contact angle A between the outer surface of each bump 14 and the upper surface of the pad 13 is equal to or less than 80°. Furthermore, the outer surface of the bump 14 inclines upward and outward; that is, angle B shown in FIG. 7 is equal to or more than 180°. Thanks to the contact angle A of equal to or less than 80°, the thermal strain resulting from the difference in thermal expansion coefficient among the each bump 14, the board 15 and the leadless component 31 is minimized, further enhancing the reliability of the electronic circuit device.

The spacer 33 serves to prevent the rolling of a two-terminal chip component. Also does the spacer 33 helps to prevent the inclination of a multi-terminal chip component such as an LCC package or a network component, which may result when the solder is applied in portions of different amounts to form bumps 14.

In order to demonstrate this specific function of the spacer 33 there were made many devices of two types A and B, wherein B is according to the third embodiment and A is another embodiment, and many devices of a comparative type which had no spacer at all. The chip components of each type-A device and that of each comparative-type device had their sides of electrodes coated with resin which cannot be wetted by solder, so that the bumps 14 might be tall. On the other hand, the chip component of each type-B device had its electrodes not coated with any resin at all. These devices were examined to see whether or not the chip components inclined to one side. They were also subjected to a thermal shock test, wherein each device was cooled and heated in 1,000 cycles, in each cycle cooled at −55° C. for 30 minutes and then heated at +125° C. for 30 minutes. The results of the test were as shown in Table 1.

TABLE 1

|  | Rolling | Bump height | Opening at bump-electrode connection |
| --- | --- | --- | --- |
| Type-B device | 1/1000 | 150 μm | 1/1000 |
| Type-A device | 30/1000 | 150 μm | 3/1000 |
| Comparative type devices | 850/1000 | 60 μm (Short one) | 543/1000 |

Note*: The word "Opening" means that at least one bump was not electrically connected to the electrode.

As is evident from Table 1, the spacer 33 serves to increase the bump height and to prevent the leadless component 31 from inclining to any side when the component is mounted on the printed wiring board 15. Thus, the spacer 33 ultimately improves the reliability of the electronic circuit device. In the third embodiment it is desirable that an excessive part of each solder mass applied be made to flow onto the side of the electrode 32, for the purpose of securing the contact between the leadless component 31 and the spacer 33. To state in another word, it is recommendable to render the outer side of each electrode very wettable with solder.

As shown in FIGS. 6 and 7, the part 14a of each solder bump 14 extends onto the side of the electrode 32 of the leadless component 31. Hence, each bump 14 is integral with the electrode 32, having an increased contacting area with respect to the electrode 32. The connection between the bumps and the electrodes is therefore made mechanically strong, ensuring reliable electrical connection between the leadless component and the printed wiring board. This enhances the reliability of the electronic circuit device.

Figure 8:
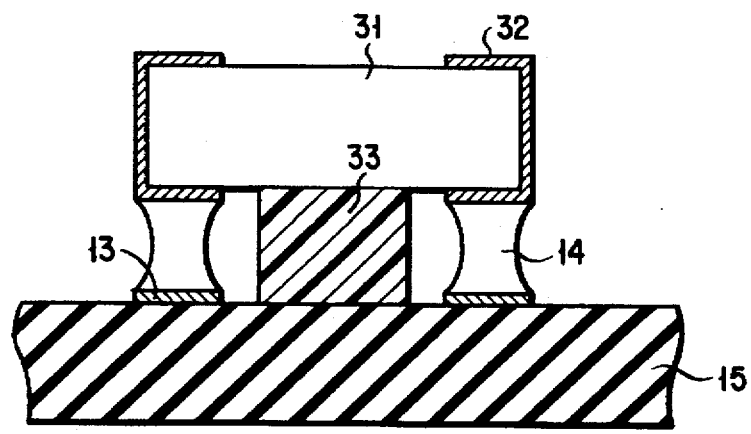
FIG. 8 is a sectional view of another modification of the device shown in FIG. 6.

With the third embodiment it is possible to form each bump 14 like an hourglass, as is illustrated in FIG. 8, by applying an appropriate amount of solder paste. The bumps 14, thus shaped, help to improve the reliability of the electronic circuit device. To form an hourglass-shaped bump, it suffices to apply solder onto the pad 13, covering the center area of the pad 13 which is about half the size of the entire pad 13. If so applied, the solder will flow to the edges of the pad 13 when it is melted in the reflow method to form an hourglass-shaped bump.

The spacer 33 is made of metal or ceramic. Since either material can radiate heat with high efficiency, the electronic circuit device has a good heat-radiation characteristic. The spacer 33 can be made of any other material having excellent heat-radiating property, such as silicon, aluminum nitride, silicon carbide, copper, aluminum, silver, gold and the like. Alternatively, the spacer 33 can be made of electrically insulating material so as to avoid short-circuiting among the solder bumps 14, to thereby raising the reliability of the device. Examples of electrically insulating materials are polyimide resin, epoxy resin, silicone resin, glass and the like.

The use of such a spacer proved to improve the electrical characteristics of the electric equipment incorporating this electronic circuit device. The spacer set the leadless component apart from the printed wiring board for a desired distance. The stray capacitance between each electrode of the leadless component and the pad or trace on the printed wiring board changed less than otherwise. The electronic circuit device can therefore have designed characteristics, as is desired particularly in high-frequency equipment.

Still another electronic circuit device, which is the fourth embodiment of this invention and which has a spacer, will be described with reference to FIG. 9 which is a sectional view of the device.

Figure 9:
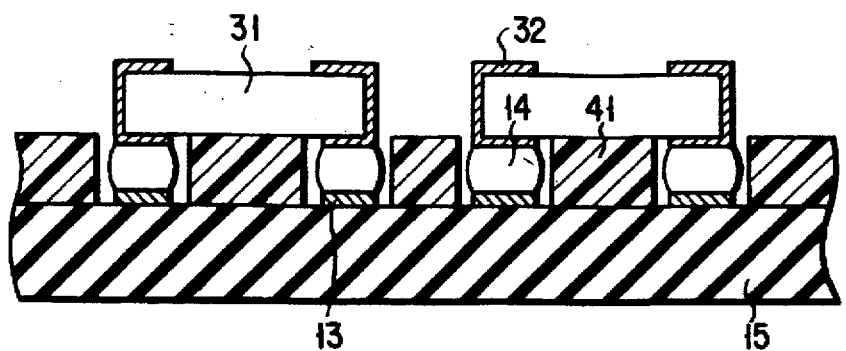
FIG. 9 is a sectional view of an electronic circuit device according to a fourth embodiment of the invention.

As FIG. 9 shows, this electronic circuit device comprises a printed wiring board 15, a plurality of chip components 31, a plurality of pads 13, a plurality of bumps 14, and a spacer 41. The pads 13 are provided on the board 15. The bumps 14 are provided on the pads 13, electrically connected thereto. The spacer 41 is mounted on the board 15, having portions each located among a group of pads 13. The chip components 31 have two electrodes 32 each. The chip components 31 are placed above some portions of the spacer 41 and also on the bumps 14, with their electrodes 32 connected to the bumps 14 which are connected to the pads 13. Thus, the chip components 31 are mounted on the printed wiring board 15.

The electronic circuit device shown in FIG. 9 is characterized in that the spacer 41 includes a portion which is located in the gap between the chip components 31. The spacer 41 can be formed in the same way as the spacers 33 of the third embodiment. To state precisely, it can be formed by depositing resist material on the board 15, forming a dry film, performing exposure and development on the dry film, making openings in the film, removing those portions of the film which are deposited on the pads 13. Thus, the spacer 41 has openings exposing the pads 13.

The method of manufacturing an ordinary electronic circuit device includes the step of coating solder resist on the printed wiring board. This step need not be conducted to manufacture the fifth embodiment of the present invention since the spacer 41 serves as a substitute for the solder resist. In addition, since all portions of the spacer 41 on the board 15 have the same thickness, the difference in amount among the solder masses applied onto the pads 13 can be minimized in the process of print-coating the solder. Working as a solder mask, the solder mask (i.e., the metal mask) used to form the bumps 14 can be thin.

An alternative method of applying solder is to use the spacer 41 as a mask and to print-coat the solder into the openings of the spacer 41. Another alternative method of applying solder is solder injection, in which solder is injected into the openings of the spacer 41. Still another method is to prepare solder pieces by punching a solder sheet and to place these pieces in the openings of the spacer 41.

Figure 11:
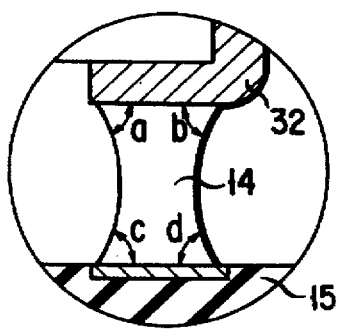
FIG. 11 is a sectional view showing one of the bumps provided in the device of FIG. 10.
Figure 12:
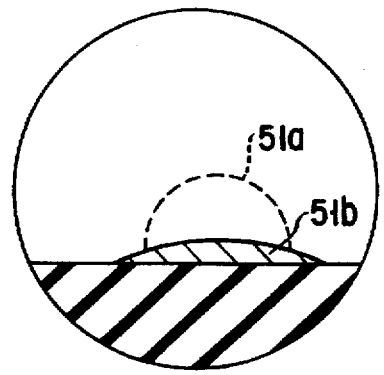
FIG. 12 is a diagram explaining how a ring-like spacer made of shape-memory alloy changes its shape with temperature.

An electronic circuit device, which is the fifth embodiment of the invention, will be described with reference to FIGS. 10, 11 and 12. This device is characterized by a spacer whose size changes with temperature.

Figure 10:
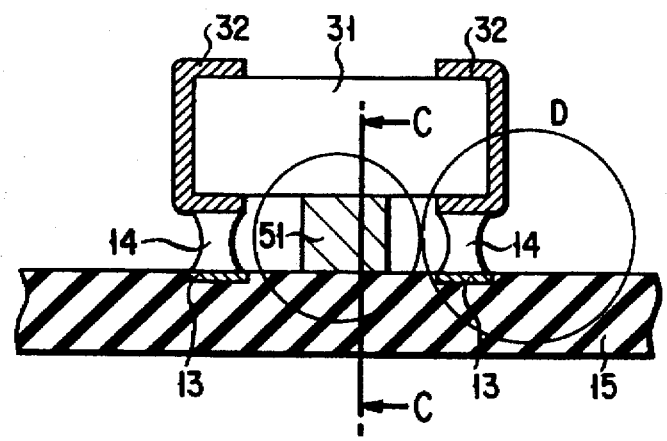
FIG. 10 is a sectional view of an electronic circuit device according to a fifth embodiment of the present invention.

FIG. 10 is a sectional view of this electronic circuit device. With reference to FIG. 10, it will be describe how the fifth embodiment is manufactured.

First, a copper foil is formed on a printed wiring board 15 made of glass-epoxy resin. The copper foil is subjected to selective etching, forming pads 13. A solder resist is coated on the exposed portions of the board 15, i.e., those portions not covered with the pads 13. A metal mask is laid on the solder resist. Solder paste is print-coated on the pads 13 by utilizing the solder resist, thereby forming bumps 14. Next, a spacer 51 made of shape-memory material is arranged on the printed wiring board 15 and located among the pads 13. Thereafter, a leadless component 31 is mounted above the spacer 51 and so positioned that its electrodes 32 are placed on the bumps 14. As a result, the component 31 is mounted on the printed wiring board 15.

The spacer 51 expands, pushing up the leadless component 31, when it is heated to a temperature equal to or higher than the melting point of solder. In other words, when the bump 14 are melted, the spacer 51 expand upwards, elongating each bump 14 and shaping it like an hourglass as shown in FIG. 11. Once the bump 14 has been so shaped and cooled, the contact angles a and b, either between the bump 14 and the lower surface of the electrode 32 are acute angles as shown in FIG. 11. So are the contact angles c and d, either between the pad 13 and the bump 14. This prevents concentration of stress in a particular part of each bump 14, improving the reliability of the electronic circuit device.

The spacer 51 may be a polygonal prism or a circular cylinder. Alternatively, it may be a ring or a spring. FIG. 12 explains how a ring-shaped spacer 51 changes its shape with temperature. As can be understood from FIG. 12, this spacer 51 remains in an initial, collapsed shape 51b at room temperature. When the bumps 14 are heated to their melting point or a higher temperature, the spacer 51 expands upwards as shown at 51a in FIG. 12. The shape-memory material, i.e., of which the spacer 51 is made, is metal such as nickel-titanium alloy, a copper alloy or the like, or resin material.

To impart reliability to the device, the bumps 14 need to have a height of at least 50 µm. The spacer 51 made of the shape-memory material must expands upwards to have a height of at least 50 µm when the bumps 14 are heated to their melting point or a higher temperature.

Electronic circuit devices according to the fifth embodiment were made, each in the following method. First, pads 13 were formed on a printed wiring board. Next, solder paste was print-coated on the pads, forming bumps 14. Then, rectangular rings 51 were mounted on the printed wiring board and used as spacers. Next, chip components 31 of 1005 type (planar size: 1.0×0.5 mm) were mounted on the bumps 14 and the rings 51, spaced apart from one another for a distance of 0.2 mm as is illustrated in FIG. 13. The bumps 14 were then melted, whereby the electrodes of each chip component 31 were connected to the pads 13.

Each rectangular ring 51 is made of a nickel-titanium shape-memory alloy wire having a diameter of 0.05 mm. It assumes a collapsed shape 51b shown in FIG. 14 at room temperature. At a 190° C. or a higher temperature, its opposing two parts defining two parallel side of the rectangular will be bent as shown at 51a in FIG. 14.

The electronic circuit devices, thus made, were subjected to a thermal shock test, wherein each device was cooled and heated in 1,000 cycles, in each cycle cooled at −55° C. for 30 minutes and then heated at +125° C. for 30 minutes. The results of the test were as shown in Table 2.

TABLE 2

| | Chip-board connection | Short-circuit among chipes | Rolling | Bump height (μm) | Cracks in bumps | Contact angles (°) | | | |
|---|---|---|---|---|---|---|---|---|---|
| | | | | | | a | b | c | d |
| Embodiment | | | | | | | | | |
| 5-1 | Attained | Not developed | Not observed | 104 | Not observed | 32 | 32 | 34 | 34 |
| 5-2 | Attained | Not developed | Not observed | 119 | Not observed | 33 | 33 | 36 | 36 |
| 5-3 | Attained | Not developed | Not observed | 141 | Not observed | 45 | 45 | 50 | 50 |
| 5-4 | Attained | Not developed | Not observed | 165 | Not observed | 60 | 60 | 55 | 55 |
| Comparative example | | | | | | | | | |
| 1 | Attained | Not developed | Observed | 25 to 151 | Observed | Not measured | | | |
| 2 | Attained | Not developed | Observed | 22 to 197 | Observed | | | | |
| 3 | Attained | Not developed | Observed | 31 to 229 | Observed | | | | |

Note*:
Comparative example was mounted with no spacer. Rolling occurred, and the bump inevitably had different heights.

In the method described above, the solder bumps 14 are print-coated on the pads 13. Instead, they may be print-coated on the lower surfaces of the electrodes of each leadless component 31.

As indicated above, the spacer 51 mounted on the board 15 and located among the pads 13 expands, pushing up the leadless component 31 and subsequently elongating and shaping each bump 14 like an hourglass, when it is heated to a temperature equal to or higher than the melting point of solder. Hence, neither rolling nor inclination of the leadless component 31 occurs, and the bumps 14 are sufficiently resistant to thermal stress.

Figure 15:
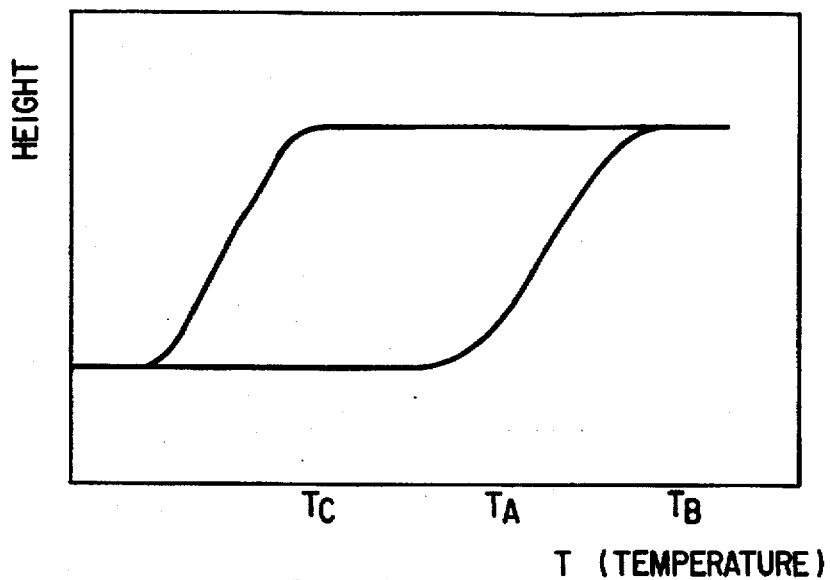
FIG. 15 is a diagram showing how the height of a step-operating bimetal spacer changes with temperature in a sixth embodiment of the invention.

Another electronic circuit device, which is the sixth embodiment of the invention, will be described with reference to FIGS. 10 and 15. This device is identical to the device of the fifth embodiment, except that a spacer 51 is made of step-operating bimetal, not a shape-memory material as in the fifth embodiment.

With reference to FIG. 10, it will be described how the device of the sixth embodiment is manufactured.

First, a copper foil is formed on a printed wiring board 15 made of glass-epoxy resin. The copper foil is subjected to selective etching, forming pads 13. A solder resist is coated on the exposed portions of the board 15, i.e., those portions not covered with the pads 13. A metal mask is laid on the solder resist. Solder paste is print-coated on the pads 13 by utilizing the solder resist, thereby forming bumps 14. Next, a spacer 51 made of step-operating bimetal is arranged on the printed wiring board 15 and located among the pads 13. Thereafter, a leadless component 31 is mounted above the spacer 51 and so positioned that its electrodes 32 are placed on the bumps 14. The leadless component 31 is thus mounted on the printed wiring board 15.

How the height of a step-operating bimetal spacer 51 changes with temperature will be explained, with reference to FIG. 15. In FIG. 15, the height of the spacer 51 is plotted on the ordinate, and the temperature on the abscissa. As seen from FIG. 15, at a temperature equal to or higher than the melting point TA of the solder, the spacer 51 bends, pushing up the leadless component 31 and subsequently elongating and shaping each bump 14 like an hourglass. When the bumps 14 reaches a temperature TB, they are then gradually cooled. Even when the temperature falls below the melting point TA of the solder, the spacer 51 made of step-operating bimetal remains in its expanding state. The bumps 14 therefore solidify, maintaining their hourglass shape. When the temperature falls to a temperature TC, the spacer 51 contracts to its initial, collapsed shape. How the spacer 51 expands and contracts will be clearly understood from FIG. 12. In FIG. 12, numeral 51a designates the expanded shape which the spacer 51 takes at the melting point TA of the solder or a higher temperature, and numeral 51b denotes the collapsed shape which the spacer 51 assumes at room temperature.

Step-operating bimetal is disclosed in Jpn. Pat. Appln. KOKAI No. 56-116824. It is comprised of two layers bound together. The first layer is a high-manganese steel layer which prominently expends at high temperatures. The second layer is a layer of stainless steel, copper or copper alloy, which prominently expands at low temperatures. High-manganese steel greatly expands as it changes from ε phase to γ phase and greatly contracts as it changes from γ phase to ε phase. The ε-to-γ transformation point is higher than the γ-to-ε transformation point. Comprised of a high-manganese steel layer and a stainless steel, copper or copper alloy layer, the bimetal deforms as it is heated and cooled, drawing a hysteresis loop. The sixth embodiment utilizes the bending of the bimetal which takes place as the high-manganese steel layer undergoes the ε-to-γ transformation. That is, the spacer 51, i.e., the step-operating bimetal, bends to push up the leadless component 31 as the high-manganese steel layer changes from ε phase to γ phase. It suffices to push the component 31 upwards so that each bump 14 may define an acute contact angle with the surface of the board 15 and also with the corresponding electrode 32 of the component 31. To push up the leadless component 31, the spacer 51 needs to be positioned with its first layer (i.e., the high-manganese steel layer) located on and above the second layer which is made of stainless steel, copper or copper alloy.

The spacer 51 is not limited to a plate-shaped one or a disc-shaped one. Furthermore, the composition of the high-manganese steel layer may be changed to adjust the ε-to-γ transformation point to any desired value. Still further, the spacer 51 can be removed, if necessary, from the electronic circuit device after the leadless component 31 has been mounted and secured to the printed wiring board 15.

Electronic circuit devices according to the sixth embodiment were made, each in the following method. First, pads 13 were formed on a printed wiring board. Next, solder paste was print-coated on the pads, forming bumps 14. Then, spacers 51, 0.5 mm thick and 2 mm long, were mounted on the printed wiring board 15. Next, chip components 31 of 1005 type (planar size: 1.0×0.5 mm) were mounted on the bumps 14 and the spacers 51. The bumps 14 were then melted, whereby the electrodes of each chip component 31 were connected to the pads 13. The spacers 51 operated stepwise at 190° C.

The electronic circuit devices, thus made, were subjected to a thermal shock test, wherein each device was cooled and heated in 1,000 cycles, in each cycle cooled at −55° C. for 30 minutes and then heated at +125° C. for 30 minutes. The results of the test were as shown in Table 3.

located on the substrate 61, electrodes 63 formed of nickel or the like and mounted on the passive element 62, and solder bumps 64 formed on the electrodes 63 by means of plating. In the case where the element 62 is a capacitor, it has a sandwich structure, comprising a lower electrode, an upper electrode and a dielectric film sandwiched between the electrodes. The lower electrode is made of platinum (Pt), a dielectric film is made of strontium titanate, and the upper electrode is made of titanium or nickel. Both electrodes and the dielectric film have been formed by sputtering. The

TABLE 3

| | Chip-board connection | Short-circuit among chipes | Rolling | Bump height (μm) | Cracks in bumps | Contact angles (°) | | | |
|---|---|---|---|---|---|---|---|---|---|
| | | | | | | a | b | c | d |
| Embodiment | | | | | | | | | |
| 6-1 | Attained | Not developed | Not observed | 102 | Not observed | 31 | 31 | 36 | 36 |
| 6-2 | Attained | Not developed | Not observed | 121 | Not observed | 35 | 35 | 34 | 34 |
| 6-3 | Attained | Not developed | Not observed | 138 | Not observed | 42 | 42 | 53 | 53 |
| 6-4 | Attained | Not developed | Not observed | 164 | Not observed | 59 | 59 | 56 | 56 |
| Comparative example | | | | | | | | | |
| 1 | Attained | Not developed | Observed | 25 to 151 | Observed | Not measured | | | |
| 2 | Attained | Not developed | Observed | 22 to 197 | Observed | | | | |
| 3 | Attained | Not developed | Observed | 31 to 229 | Observed | | | | |

Note*:
Comparative example was mounted with no spacer. Rolling occurred, and the bump inevitably had different heights.

In the above-described method of manufacturing the devices according to the six embodiment, the solder bumps 14 are print-coated on the pads 13. Instead, they may be print-coated on the lower surfaces of the electrodes of each leadless component 31.

As explained above, the spacer 51 which is mounted on the board 15 and located among the pads 13 and which is a step-operating bimetal, bends and pushes up the leadless component 31 and subsequently elongating and shaping each bump 14 like an hourglass, when it is heated to a temperature equal to or higher than the melting point TA of solder. Hence, neither rolling nor inclination of the leadless component 31 occurs, and the bumps 14 are sufficiently resistant to thermal stress.

Still another electronic circuit device, which is the seventh embodiment of the invention, will be described with reference to FIGS. 16 and 17. This device is characterized in that spacers are incorporated in the leadless component, to prevent rolling of the component.

Most chip capacitors hitherto used are multi-layered ceramic ones, and most chip registers hitherto used are thick-film ones. In recent years, thin-film chip capacitors and thin-film chip registers have been developed to replace the multi-layered ceramic chip capacitors and the thick-film chip resisters. This is because the thin-film capacitors and resistors have electrical characteristics more close to the design values and exhibit better temperature characteristics. Moreover, chip inductors which has electrical characteristics little deviating from the design values and improved temperature characteristic have also been developed.

Figure 16:
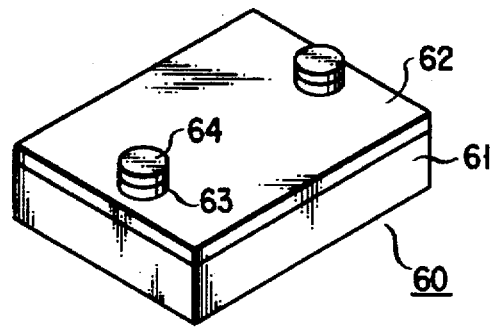
FIG. 16 is a perspective view of one of the thin chip components incorporated in an electronic circuit device which is a seventh embodiment of the invention.

FIG. 16 is a perspective view of one of the thin-film chip components 60 incorporated in an electronic circuit device according to the seventh embodiment. As shown in FIG. 16, the thin-film chip component 60 comprises a substrate 61 made of silicon or the like, a thin-film passive element 62 electrodes 63 are connected to the lower and upper electrodes of the thin-film passive element 62.

Figure 17:
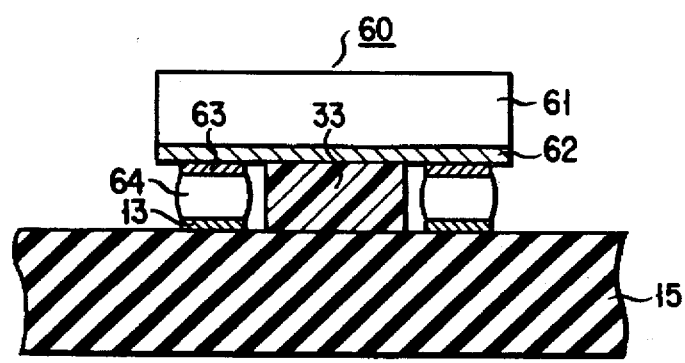
FIG. 17 is a sectional view of the device shown in FIG. 16.

FIG. 17 is a sectional view of the electronic circuit device comprising a printed wiring board 15 and thin-film chip components 60 of the type shown in FIG. 16. As seen from FIG. 17, the thin-film passive element 62 of each thin-film chip component 60 is connected to the pads 13 on the board 15 by the solder bumps 63. The pads 13 and the bumps 14 provide a gap between the thin-film chip component 60 and the printed wiring board 15. A spacer 33 is placed in this gap. The spacer 33 is of that type used in the third embodiment of the present invention.

Since the thin-film passive element 62 of the component 60 is connected to the pads 13 by the solder bumps 63, the thin-film chip component 60 is likely to roll or incline to the printed wiring board 15. Nonetheless, the spacer 33, which is interposed between the element 62 and the board 15, serves to prevent rolling or inclining of the component 60 with respect to the printed wiring board 15.

The third to seventh embodiments have a spacer which is necessary at the time of mounting the leadless component on the printed wiring board, more precisely on the bumps. Once the leadless component has been mounted on the printed wiring board, the spacer is no longer necessary and may be removed from the electronic circuit device. The spacer, if made of, for example, a dry film resist, it can be removed by etching.

An electronic circuit device, which is the eighth embodiment of the invention, will be described with reference to FIGS. 18 and 19. The device has members used in place of spacers to prevent leadless components form rolling or inclining to a printed wiring board.

As shown in FIGS. 18 and 19, the electronic circuit device according to the eighth embodiment comprises a printed wiring board 15, pads 13 provided on the board 15, bumps 14 mounted on the pads 13, a leadless component 31 mounted on the bumps 14, with its electrodes 32 contacting the bumps 14, and a pair of pillars 71 projecting upwards from the board 15. The bumps 14 space the leadless component 31 from the printed wiring board 15. The pillars 71 are taller than the bumps 14, each having an upper end portion extending along one side of the component 31.

The method of manufacturing the eighth embodiment will be explained.

First, a copper foil is formed on a printed wiring board 15 made of glass-epoxy resin. The copper foil is subjected to selective etching, forming pads 13. A solder resist is coated on the exposed portions of the board 15, i.e., those portions not covered with the pads 13. Next, pillars 71 made of insulating material such as glass fiber or epoxy resin are adhered to the printed wiring board 15. In the present embodiment, the pillars 71 are glass fibers, each 0.2 mm thick and 0.3 mm long, and are adhered to the board 15 with epoxy adhesive.

Thereafter a metal mask is laid on the pads 13. Solder paste is print-coated on the pads 13 by utilizing the solder mask. The metal mask has holes or notches, in which the upper end portions of the pillars 71 are positioned when the mask is laid on the pads 13. Then, solder paste is print-coated on the pads 13 by utilizing the metal mask, thereby forming solder bumps 14 on the pads 13.

Next, the leadless component 31 is placed on the solder bumps 14 and positioned such that the electrodes 32 contact the bumps 14 at their lower surfaces. This done, the bumps 14 are melted and cooled by reflow method, whereby the component 31 is mounted on the printed wiring board 15. The electronic circuit device of this embodiment is thereby manufactured.

In the case where the solder wets the side of the electrode 32, the bump 14 has an increased contacting area with respect to the electrode 32. This improves the reliability of the electronic circuit device.

To impart adequate reliability to the electronic circuit device, the solder bumps 14 must have a height of at least 50 μm. It follows that the pillars 71 need to be far taller than 50 μm. Preferably, the pillars 71 are taller than the solder bumps 14 by at least half the thickness of the component 31, so that they may not project above the upper surface of the leadless component 31.

The cross section of each pillar 71 has a width ranging from 0.2 mm to the gap between adjacent components 31 and a length raging from 0.2 mm to the length of the longer sides of the components 31. The cross-section shape of the pillar 71 is not limited to a rectangular one. Rather, it may be circular, elliptical, triangular, square or polygonal.

The pillars 71 may be formed by any other method other than that method described above. Each pillar 71 may be formed by piling dry films to a desired height, thus forming a pillar, and then transferring this pillar onto the printed wiring board 15. Alternatively, each pillar 71 may be formed by cutting a glass plate, obtaining a glass pillar, and then transferring the glass pillar onto the printed wiring board 15.

Electronic circuit devices according to the eighth embodiment were made, each in the method described above. Each device had six chip components 31 of 1005 type (planar size: 1.0×0.5 mm) mounted on solder bumps 14 and spaced apart from one another by 0.2 mm. Furthermore, comparative electronic circuit devices were made which were identical to the devices of this invention, except that they had no pillars protruding form the printed wiring boards.

The electronic circuit devices of this invention and the comparative devices were subjected to a thermal shock test, wherein each device was cooled and heated in 1,000 cycles, in each cycle cooled at −55° C. for 30 minutes and then heated at +125° C. for 30 minutes. The results of the test were as shown in Table 4. The item "Cracks in bumps" in Table 4 means whether or not cracks were observed in the bumps after the thermal shock test.

TABLE 4

|  | Chip-board connection | Short-circuit among chipes | Rolling | Bump height (μm) | Cracks in bumps |
| --- | --- | --- | --- | --- | --- |
| Embodiment |  |  |  |  |  |
| 8-1 | Attained | Not developed | Not observed | 102 | Not observed |
| 8-2 | Attained | Not developed | Not observed | 124 | Not observed |
| 8-3 | Attained | Not developed | Not observed | 133 | Not observed |
| 8-4 | Attained | Not developed | Not observed | 141 | Not observed |
| 8-5 | Attained | Not developed | Not observed | 149 | Not observed |
| 8-6 | Attained | Not developed | Not observed | 161 | Not observed |
| Comparative example |  |  |  |  |  |
| 1 | Attained | Not developed | Observed | 25 to 151 | Observed |
| 2 | Attained | Not developed | Observed | 22 to 197 | Observed |
| 3 | Attained | Not developed | Observed | 31 to 229 | Observed |

Note*:
Rolling occurred, and the bump inevitably had different heights.

In the above-described method of manufacturing the devices according to the eighth embodiment, the solder bumps 14 are print-coated on the pads 13. Instead, they may be print-coated on the lower surfaces of the electrodes of each leadless component 31.

As described above, a pair of pillars 71 are provided for each of the leadless components 31, extend upwards along at the longer sides of the leadless component 31, and prevent the component 31 from rolling or inclining to the printed wiring board 15 while being mounted onto the board 15. The use of the pillars therefore makes it easy to reliably connect the components 31 to the printed wiring board 15 even if the components 31 are arranged in high density.

The present invention is not limited to the embodiments described above. Various changes and modifications may be achieved without departing from the spirit and scope of the present invention. The scope of the invention is defined by the claims set forth hereinafter, and is not restricted from the above description. Any change or modification that is considered to be equivalent to any item specified in the claims falls within the scope of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An electronic circuit device comprising:

a printed wiring board having a major surface and pads provided on the major surfaces;

a leadless component located above the major surface of said printing wiring board and having a major surface opposing the major surface of said printed wiring board;

a plurality of electrodes which are each provided on at least a part of the major surface of said leadless component and one side of said leadless component;

a plurality of bumps electrically connecting said pads to said plurality of electrodes, respectively, so as to provide a distance between opposing ones of said plurality of electrodes of said pads;

a plurality of electrically conductive members integral with said bumps, each one of said plurality of electrically conductive members extending from one of said bumps onto a region of one of said plurality of electrodes that is provided on a side of said leadless component; and a spacer located in a gap between the major surface of said leadless component and the major surface of said printed wiring board, wherein the outermost part of each one of said plurality of bumps is located above outside an outer edge of a corresponding one of said pads, as said leadless component is viewed from above.

2. The electric circuit device according to claim 1, wherein each of said pads has an outer edge substantially aligned with an outer edge of that portion of the corresponding electrode which is provided on the major surface of said leadless component.

3. The electric circuit device according to claim 1, wherein an outer surface of each of said bumps and an inner surface of the pad connected to the bump define a contact angle of at least 90°.

4. The electric circuit device according to claim 1, wherein an outer surface of each of said bumps and an inner surface of the pad connected to the bump define a contact angle of at most 90°, and the outer surface of the bump is bent by an angle greater than the contact angle.

5. The electric circuit device according to claim 1, wherein a part of each of said bumps looks bulging from the side of said leadless component, as said leadless component is viewed from above.

6. The electric circuit device according to claim 1, wherein an outermost part of each of said bumps looks located substantially at a midpoint on the side of said leadless component, as said leadless component is viewed from above.

7. The electric circuit device according to claim 1, wherein said leadless component is a multi-terminal surface-mount component.

8. The electric circuit device according to claim 1, wherein said leadless component is a two-terminal chip component.

* * * * *